United States Patent
Kubota et al.

(10) Patent No.: US 8,260,571 B2
(45) Date of Patent: Sep. 4, 2012

(54) ANALYSIS APPARATUS

(75) Inventors: Tetsuyuki Kubota, Kawasaki (JP);
Nobutaka Itoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 407 days.

(21) Appl. No.: 12/505,904

(22) Filed: Jul. 20, 2009

(65) Prior Publication Data

US 2010/0023299 A1 Jan. 28, 2010

(30) Foreign Application Priority Data

Jul. 22, 2008 (JP) ................................. 2008-188147

(51) Int. Cl.
*G01B 11/24* (2006.01)
*G06F 15/00* (2006.01)

(52) U.S. Cl. ................................. 702/167; 703/1; 716/9

(58) Field of Classification Search .................. 702/167, 702/183; 703/1, 14; 716/9, 15, 136, 137
See application file for complete search history.

(56) References Cited

U.S. PATENT DOCUMENTS 7,483,818 B2 * 1/2009 Amakai et al. .................... 703/1
2008/0168413 A1 * 7/2008 Kakino et al. .................... 716/9

FOREIGN PATENT DOCUMENTS

| JP | 10-093206 | 4/1998 |
| JP | 2004-013437 | 1/2004 |
| JP | 2006-039692 | 2/2006 |

* cited by examiner

*Primary Examiner* — John H Le
(74) *Attorney, Agent, or Firm* — Staas & Halsey LLP

(57) ABSTRACT

An analysis apparatus includes an assignor assigning a physical property value corresponding to the kind of a material to each of regions formed by dividing a structural data representing a structure of a multilayer substrate, a determiner determining whether or not the each of the region belongs to a predetermined region in a layer of a predetermined kind, and a physical property value changer changing the physical property value of the region belonging to a predetermined region in a layer of a predetermined kind.

14 Claims, 18 Drawing Sheets

S101

S102

DRILL HOLE
S103

VIA PLATING
S104
INSULATOR

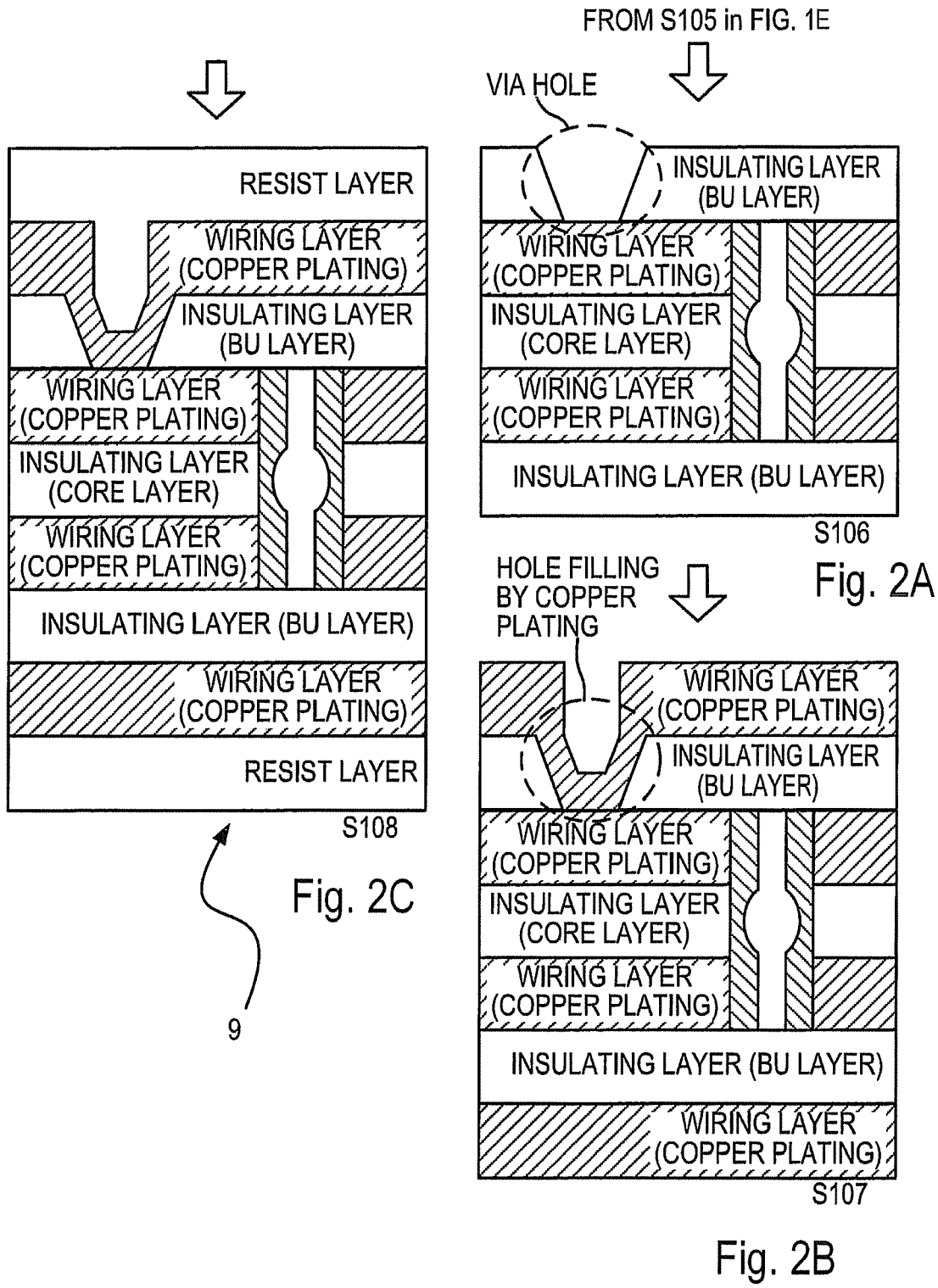

FIG. 9

| MESH SERIAL NUMBER | EDGE COORDINATE 1 | EDGE COORDINATE 2 | EDGE COORDINATE 3 | EDGE COORDINATE 4 |
|---|---|---|---|---|
| 1 | 0,0,0 | 1,0,0 | 0,1,0 | 0,1,1 |
| 2 | 1,0,0 | 2,0,0 | 2,1,0 | 0,2,1 |
| ... | ... | ... | ... | ... |

FIG. 11

| GROUP NAME | MESH SERIAL NUMBER |
|---|---|
| CU_L01 | 120, 121, 123, 203, 204, 206.. |
| CU_L01L02 | 301, 302, 303, 304.. |
| ... | ... |

FIG. 16
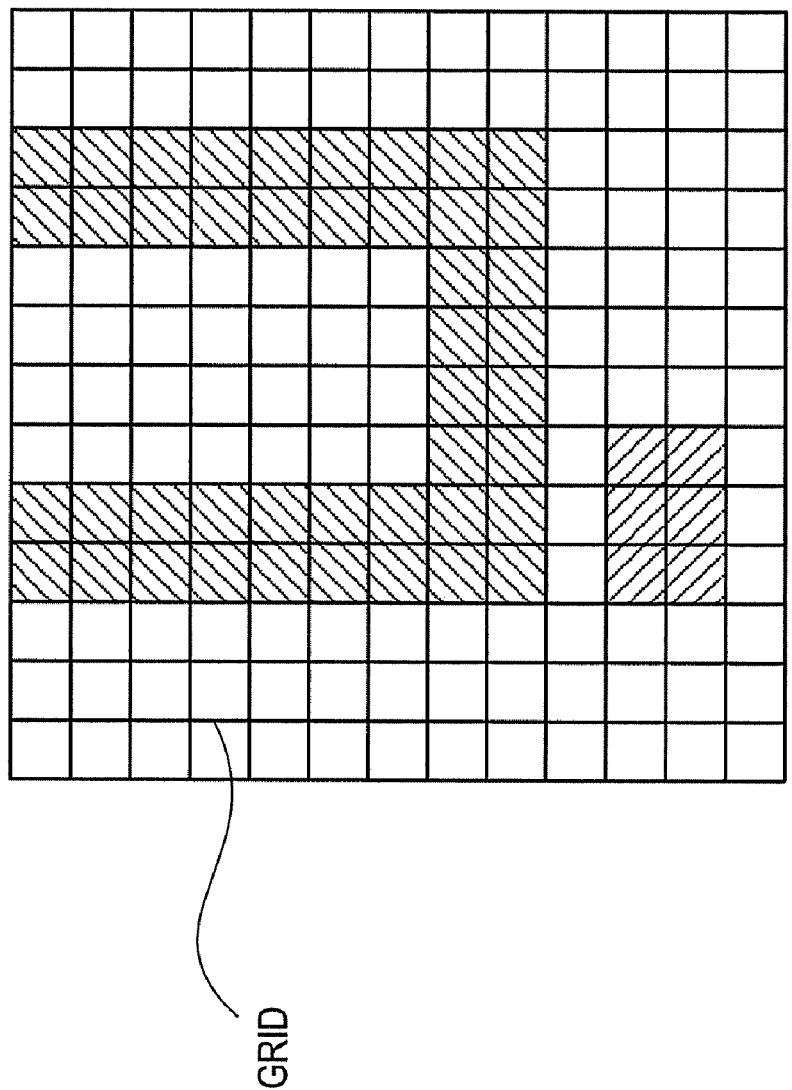
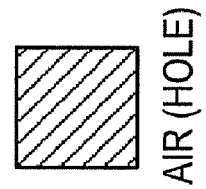
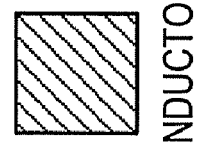

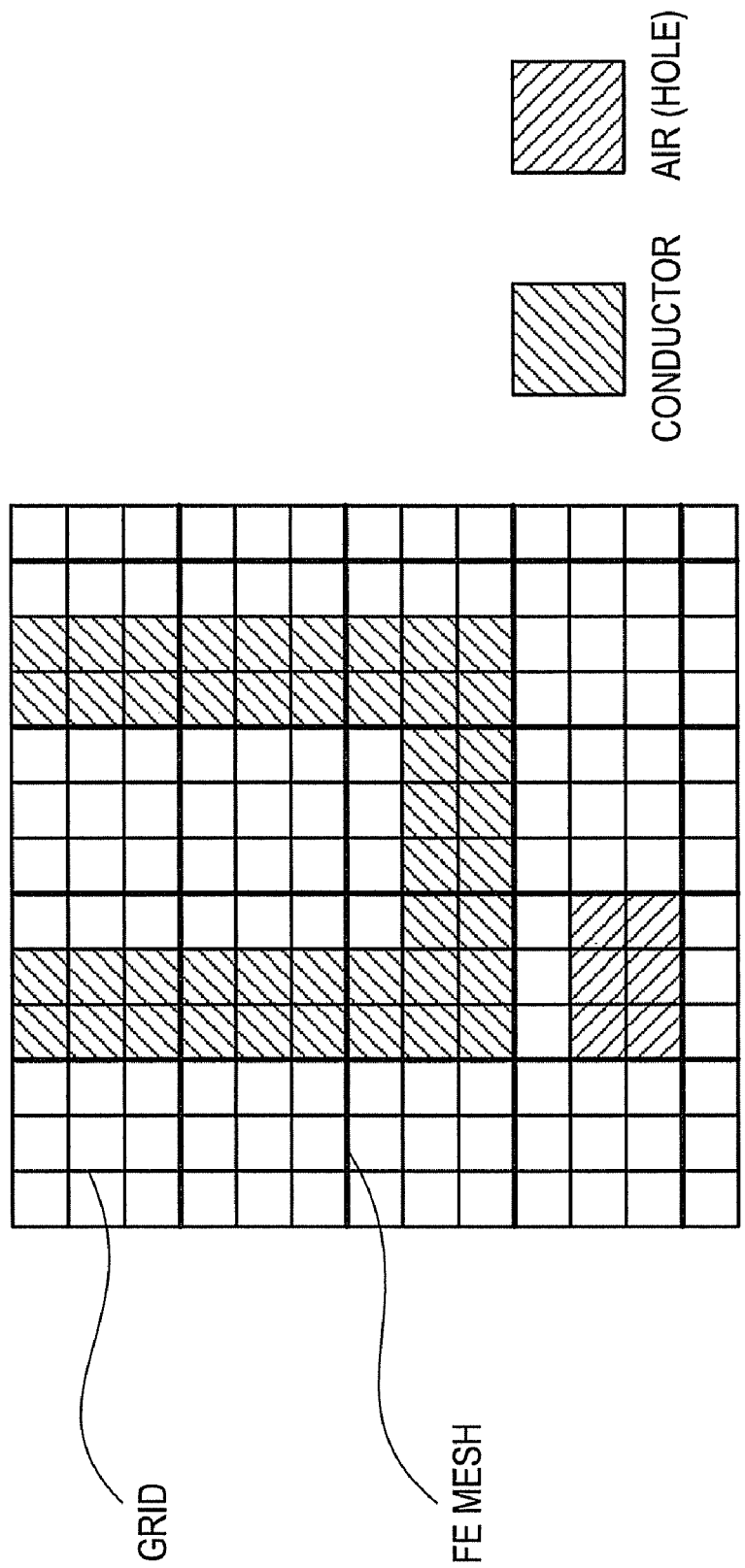

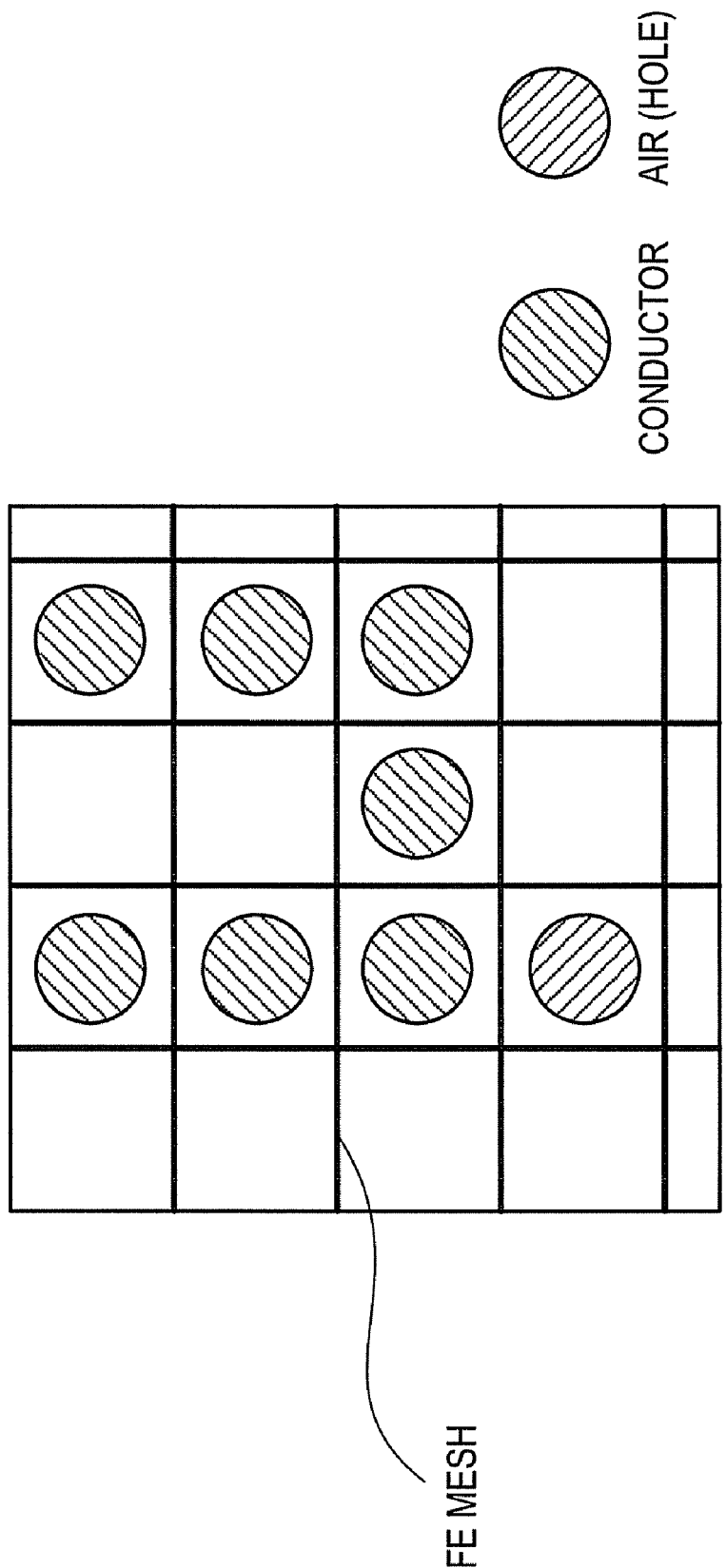

ANALYSIS APPARATUS

CROSS-REFERENCE TO RELATED APPLICATIONS

This application is based upon and claims the benefit of priority of the prior Japanese Patent Application No. 2008-188147, filed on Jul. 22, 2008, the entire contents of which are incorporated by reference herein.

BACKGROUND

1. Field

The embodiments discussed herein are related to the warp analysis of a multilayer substrate.

2. Description of the Related Art

A multilayer substrate made of a plurality of substrates is warped in a process in which a thermal load is applied to the substrate. Such a process may be a reflow soldering process. The causes of the warp include a wiring pattern and a wiring ratio of each wiring layer, the arrangement of interlayer vias which are plating holes connecting between the layers in the multilayer substrate, the arrangement of solder resist, the arrangement of standard size perforated lines, and the like. The warp is predicted by using numerical simulation utilizing the warp analysis, and the prediction is fed back to the design of the multilayer substrate. As a result, it is possible to design the multilayer substrate with less warp.

Further, in the warp analysis, there is known a technique to generate, on the basis of wiring CAD (Computer Aided Design) data, the arrangement of interlayer vias, the arrangement of solder resist, and the arrangement of standard size perforated lines. The CAD data is design information of the multilayer substrate, i.e. structural analysis mesh (hereinafter referred to as FE (Finite Element) mesh) data in which there are reflected the wiring pattern for each wiring layer.

In the following, the generation of the conventional FE mesh will be described with reference to the accompanying drawings. FIG. 16 to FIG. 18 are figures showing a method for generating the conventional FE mesh.

First, as shown in FIG. 16, a wiring shape (positions of conductor and air in FIG. 16) is divided into lattice-shaped grids on the basis of wiring CAD data. Next, as shown in FIG. 17, a FE mesh made of a predetermined number of grids is prepared, so that the content of the conductor or the air (hole) in the FE mesh is calculated. Then, as shown in FIG. 18, the FE mesh whose calculated content is equal to or greater than a predetermined threshold value is determined as a portion where the conductor or air exists. Conventionally, the warp analysis has been performed on the basis of the FE mesh generated in this way.

Japanese Laid-open Patent Publication No. 2004-13437 discloses a technique in which a plurality of n elements that have arbitrary shapes is created. The plurality of n elements is used to divide a multilayer wiring substrate into a plurality of regions on the basis of model data representing the external shape, and the like, of the multilayer wiring substrate. Data of wiring pattern P formed in the multilayer wiring substrate are then compared to the respective n elements so that a ratio occupied by the wiring pattern P is calculated for each layer and each element on the basis of a residual copper ratio. A warp analysis of the multilayer wiring substrate is then performed on the basis of the residual copper ratio of each element and on the basis of mechanical physical property values of each element.

Japanese Laid-open Patent Publication No. 2006-39692 discloses a technique in which a single layer model is generated for each layer of an analysis object formed by laminating plate-shaped bodies, each having a non-uniform in-layer material, on the basis of the external shape of the analysis object and the composition of the each layer. A laminated shell model is generated from the single layer model for the each layer of the analysis object by using thickness information of the each layer. A neutral surface is calculated from the laminated shell model. A deformed neutral surface is calculated by applying a boundary condition to the neutral surface, and a deformation of the laminated shell model is calculated by using the deformation of the neutral surface and the thickness information.

SUMMARY

According to an aspect, an analysis apparatus includes an assignor assigning a physical property value corresponding to the kind of a material to each of regions formed by dividing a structural data representing a structure of a multilayer substrate, a determiner determining whether or not the each of the region belongs to a predetermined region in a layer of a predetermined kind, and a physical property value changer changing the physical property value of the region belonging to a predetermined region in a layer of a predetermined kind.

It is to be understood that both the foregoing general description and the following detailed description are exemplary and explanatory and are not restrictive of the invention, as claimed.

The above-described embodiments of the present invention are intended as examples, and all embodiments of the present invention are not limited to including the features described above.

BRIEF DESCRIPTION OF THE DRAWINGS

FIGS. 2A to 2C are figures showing the manufacturing process of the built-up substrate;

FIG. 9 is a figure showing correspondence between mesh serial numbers and edge coordinates;

FIG. 11 is a figure showing an example of classification based on layers and materials;

FIG. 16 is a figure showing a method for generating a conventional FE mesh;

FIG. 17 is a figure showing a method for generating a conventional FE mesh; and

FIG. 18 is a figure showing a method for generating a conventional FE mesh.

DETAILED DESCRIPTION OF THE PREFERRED EMBODIMENTS

Figure 1A:
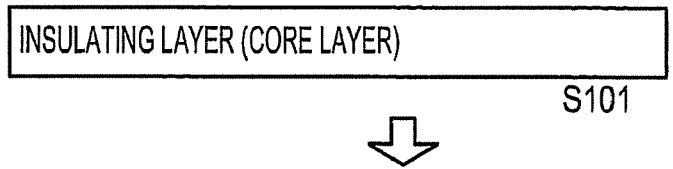
FIGS. 1A to 1E are figures showing a manufacturing process of a built-up substrate.

Reference may now be made in detail to embodiments of the present invention, examples of which are illustrated in the accompanying drawings, wherein like reference numerals refer to like elements throughout.

In the following, embodiments according to the present invention will be described with reference to the accompanying drawings. First, there will be described a manufacturing process of a common built-up substrate as an analysis object of the warp analysis according to the present embodiment. FIGS. 1A-1E and 2A-2C are figures showing a manufacturing process of a built-up substrate.

Figure 1B:
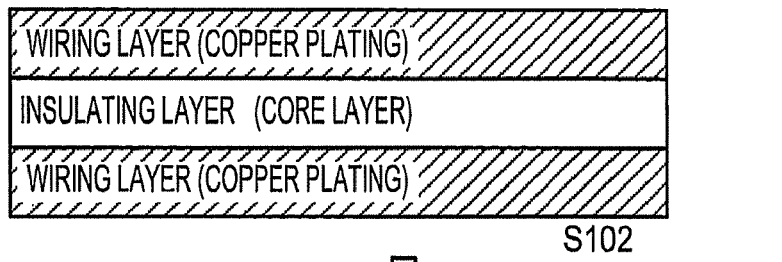
Figure 1C:
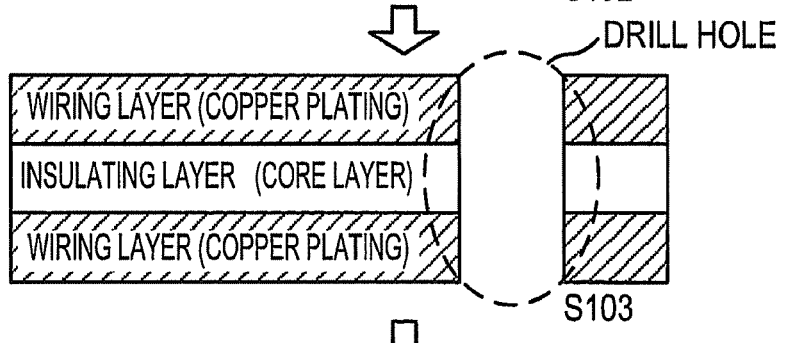

First, there is prepared an insulating layer made of an insulation material (FR4 and the like) as a core layer (FIG. 1A). Copper plating is applied as a wiring layer to both surfaces of the core layer (FIG. 1B). A hole having a diameter of about φ0.5 mm is formed with a drill at a portion of the substrate subjected to the copper plating, in which portion a via is to be provided (FIG. 1C).

Figure 1D:
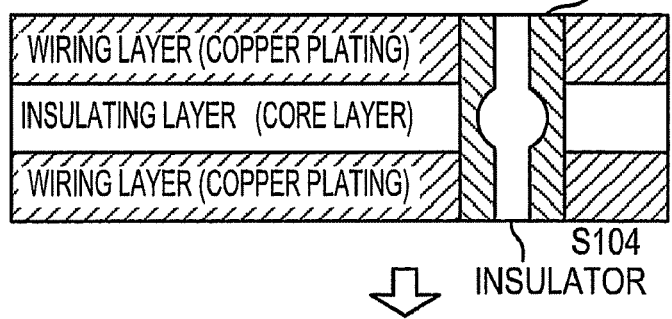
Figure 1E:
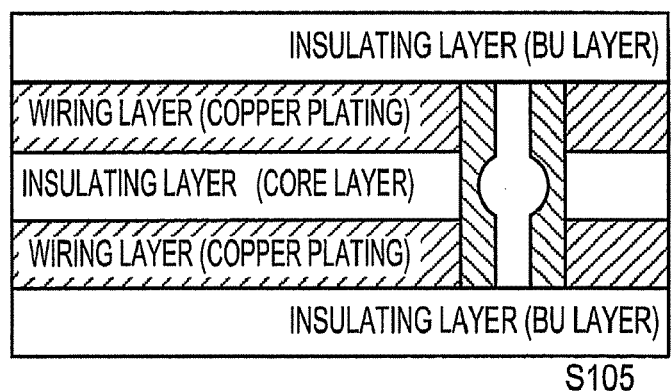

Via plating by copper is applied to the hole, and the inside of the hole is filled with an insulator (FIG. 1D). Note that the plating is not uniformly applied to the hole, and the plating thickness at the central position in the thickness direction (at the position near the core layer in the figure) is reduced. Further, the plating applied to the hole is different from the plating applied to the wiring layer. A built-up resin material is attached as an insulating layer (BU layer) to both the surfaces of the substrate whose hole is subjected to the plating (FIG. 1E).

Next, in order to provide a via hole in the substrate to which the BU layer is attached, a hole is formed, as shown in FIGS. 2A to 2C, in the built-up resin material (in the BU layer of the substrate upper portion in FIGS. 2A to 2C) by using laser (FIG. 2A). Note the hole is generally formed into a trapezoidal shape. Further, copper plating is applied, as wiring layers, to the BU layers on both the surfaces of the substrate, in the upper BU layer of which the hole is formed (FIG. 2B). Note that the via hole is also filled by the copper plating in this case, the filled portion becomes a trapezoidal shape similar to the shape of the hole formed in the BU layer.

Further, in the case where substrate layers are laminated, the processing of operations FIG. 2A to FIG. 2B is repeated. Finally, a resist material is attached, as a resist layer, to both the surfaces of the substrate whose BU layers are subjected to the copper plating (FIG. 2B). In the following, a nine layer built-up substrate manufactured in this way is assumed as an analysis object substrate (multilayer substrate 9, shown in FIG. 13) in the present embodiment. Note that the plating to the substrate may be performed by using a conductor material other than copper.

Figure 3:
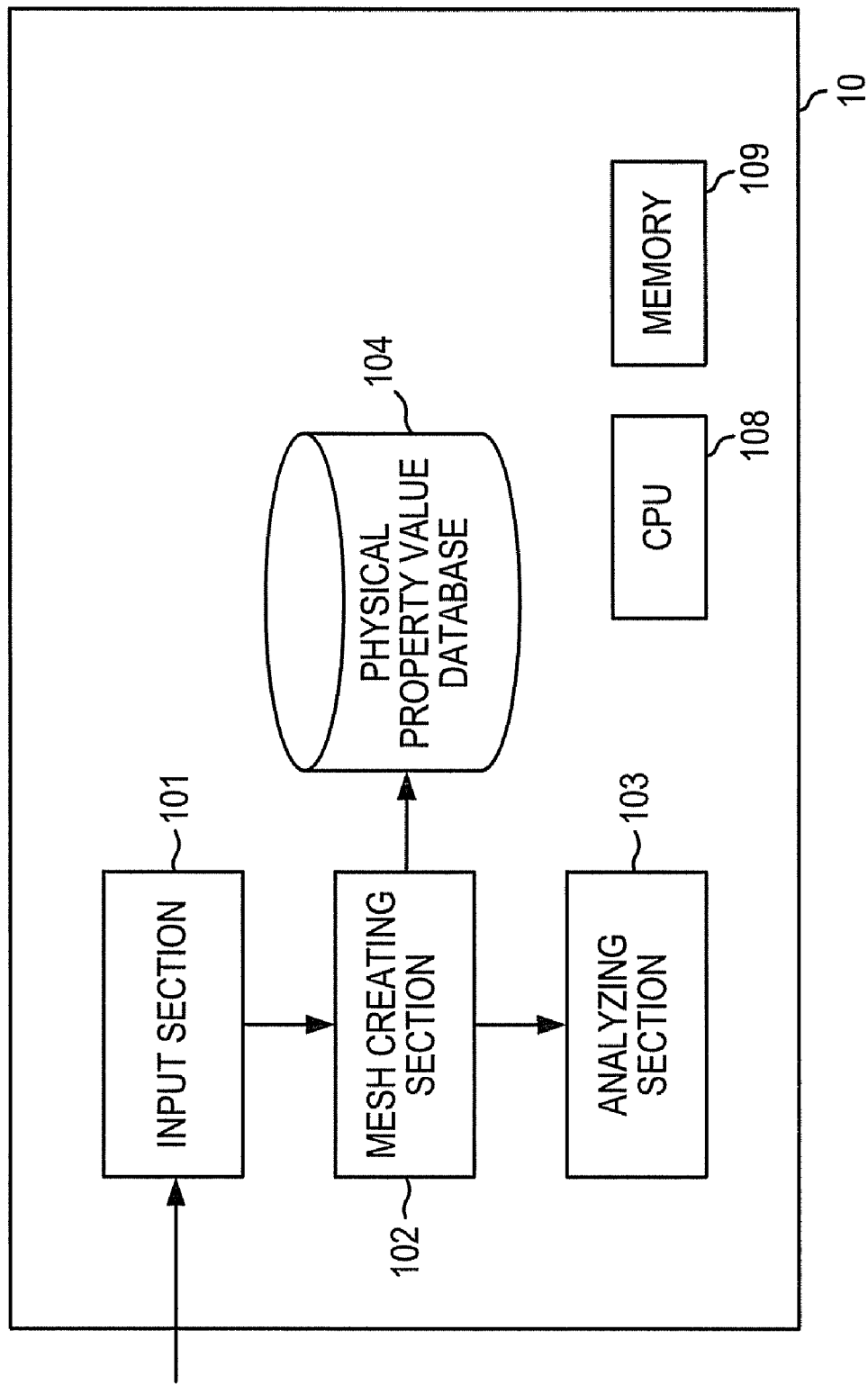
FIG. 3 is a block diagram showing a configuration of a multilayer substrate analysis apparatus according to an embodiment of the present invention.
Figure 4:
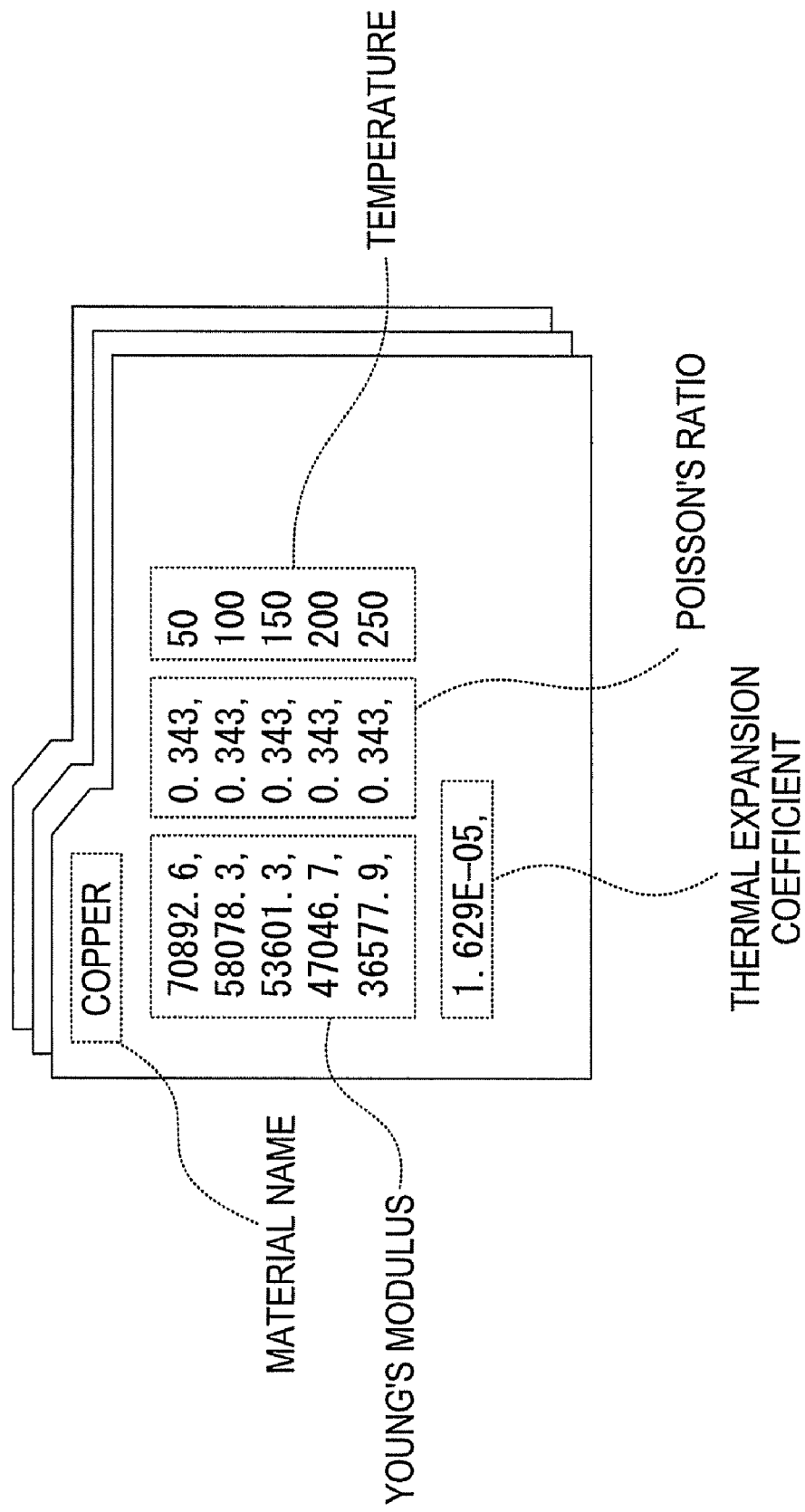
FIG. 4 is a figure showing physical property value information.

Next, there will be described a multilayer substrate analysis apparatus according to the present embodiment. FIG. 3 is a block diagram showing a configuration of a multilayer substrate analysis apparatus according to the present embodiment. Further, FIG. 4 is a figure showing physical property value information.

The multilayer substrate analysis apparatus 10 according to the present embodiment includes an input section 101, a mesh creating section 102 (an assigning section, a determining section, a physical property value changing section), an analyzing section 103, a physical property value database 104, a CPU 108, and a memory 109.

The input section 101 is configured to receive wiring CAD data (structural data) which is design information representing the structure of the multilayer substrate 9. Further, the mesh creating section 102 is configured to create an analysis mesh (grid mesh) on the basis of the wiring CAD data of the multilayer substrate 9 (shown in FIG. 13) inputted into the input section 101. Further, the analyzing section 103 is configured to perform warp analysis on the basis of the analysis mesh created by the mesh creating section 102. Note that it is assumed that all processing in the input section 101, the mesh creating section 102, and the analyzing section 103 is performed by the CPU 108 and the memory 109.

Further, the physical property value database stores physical property value information used in the mesh creating section 102. The physical property value information is information which is prepared for each material and in which a material name, a Young's modulus and Poisson's ratio at each temperature, and a thermal expansion coefficient are made to correspond to each other, as shown in FIG. 4.

Figure 5:
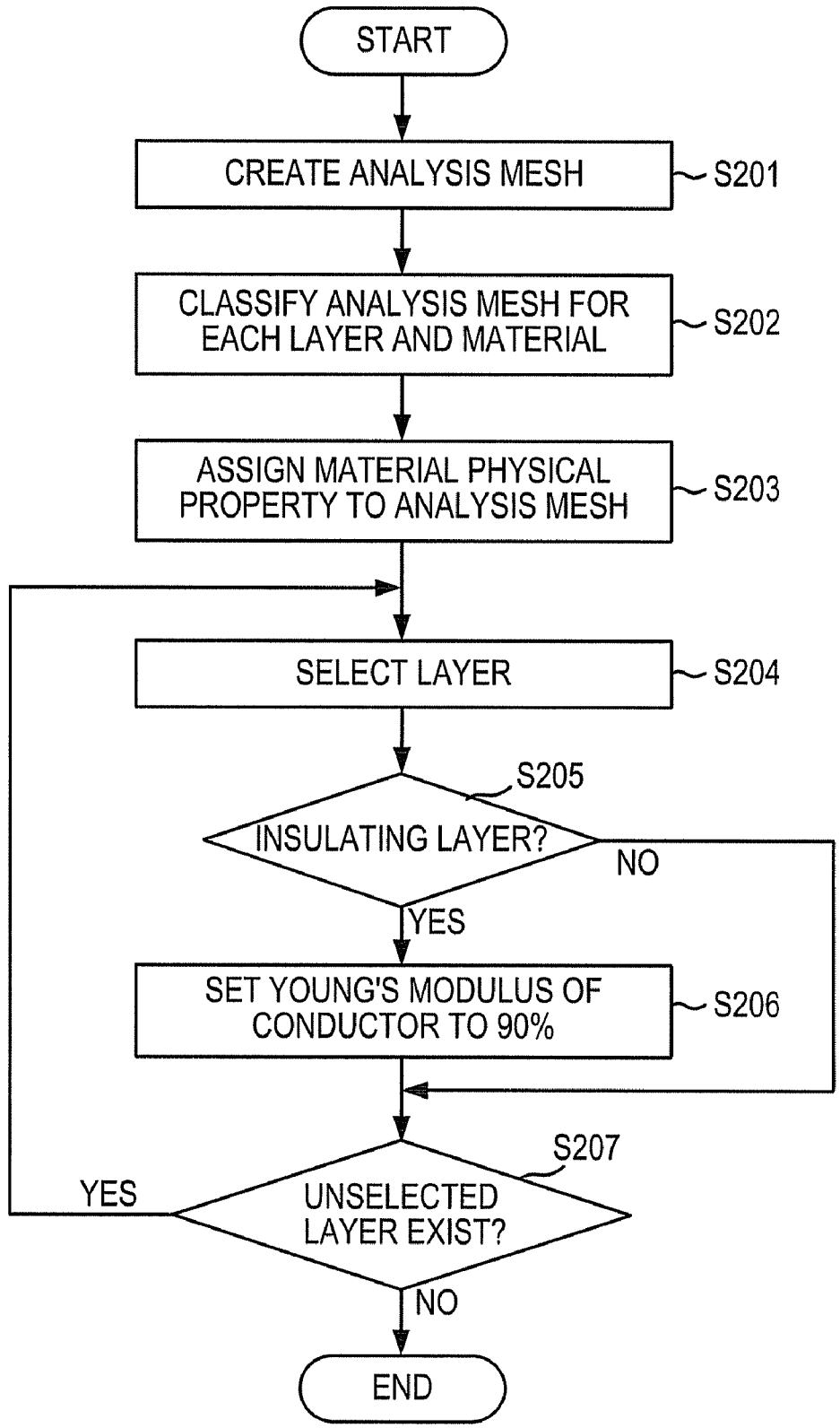
FIG. 5 is a flow chart showing an operation of a mesh creating section.

Next, there will be described an operation of the mesh creating section 102 in the multilayer substrate analysis apparatus according to the present embodiment. FIG. 5 is a flow chart showing an operation of the mesh creating section. Note that it is assumed that in this figure, the wiring CAD data of the multilayer substrate 9 (shown in FIG. 13) is already inputted into the input section.

First, the mesh creating section 102 (shown in FIG. 3) creates an analysis mesh on the basis of the wiring CAD data inputted into the input section 101 (S201).

Figure 6:
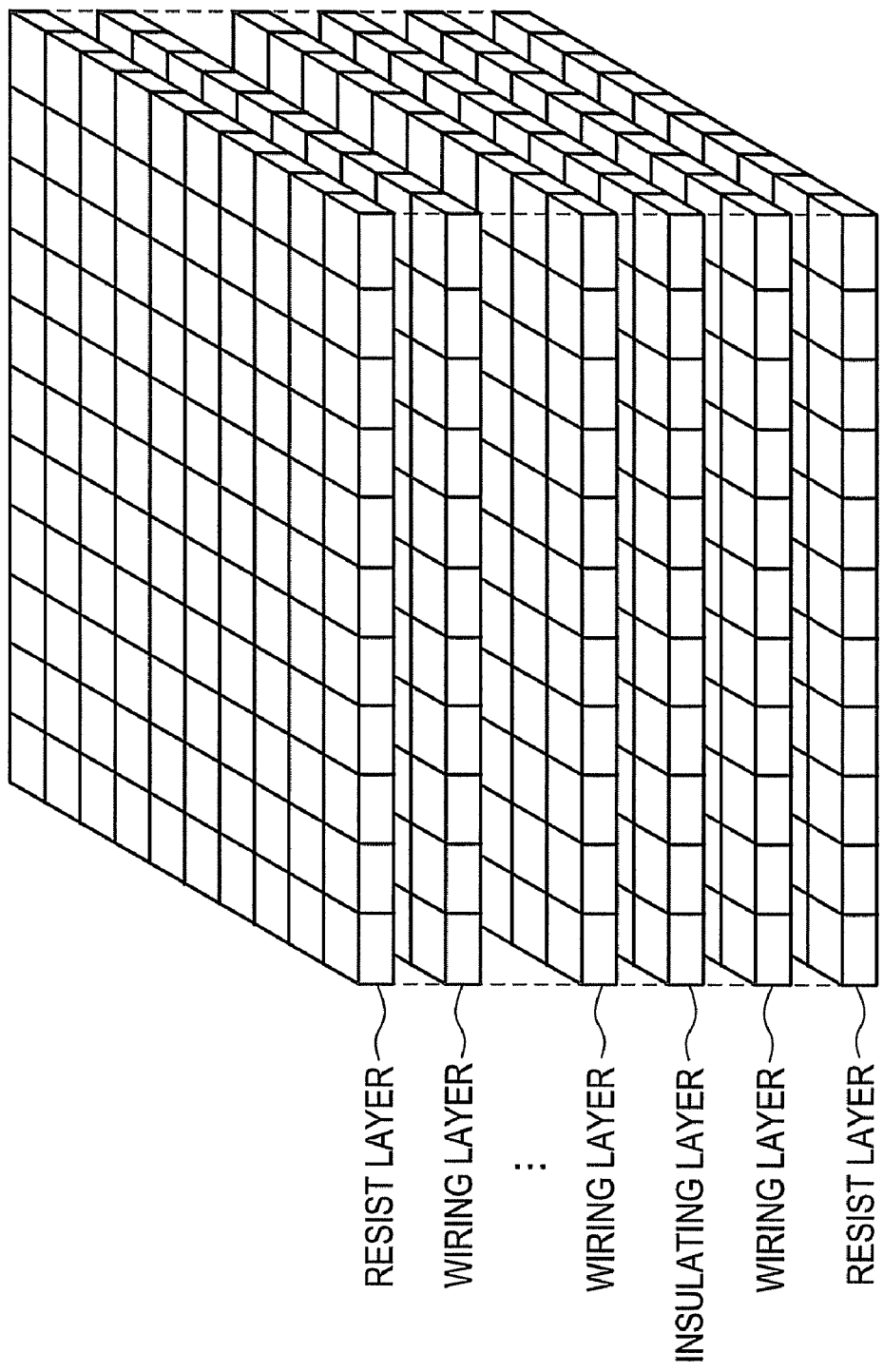
FIG. 6 is a figure showing a three-dimensional mesh model.
Figure 7:
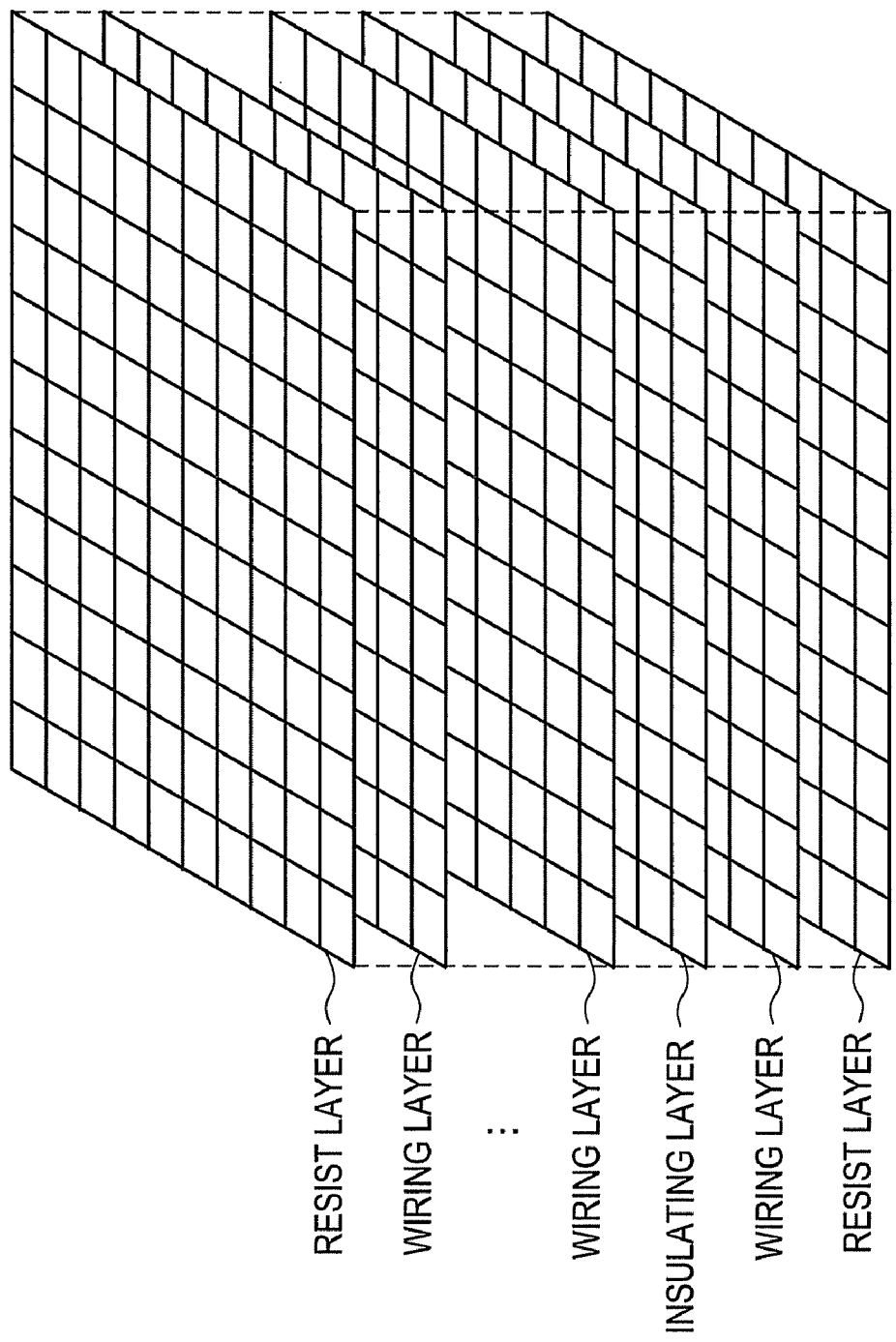
FIG. 7 is a figure showing a laminated shell model.

Here, there will be described the analysis mesh. FIG. 6 is a figure showing a three-dimensional mesh model. FIG. 7 is a figure showing a laminated shell model. The three-dimensional mesh model as the analysis mesh shown in FIG. 6 is based on a grid in which the wiring shape based on the wiring CAD data of the multilayer substrate 9 (shown in FIG. 13) is divided into lattice-shape grids. That is, each layer of the wiring CAD data of the multilayer substrate is divided into a plurality of regions.

Specifically, as described in the background art, the mesh creating section 102 (shown in FIG. 3) prepares an FE mesh made of a predetermined number of grids, and calculates the content of the conductor or air (hole) in the FE mesh, so as to determine, as a conductor existing portion or air existing portion, a region in the FE mesh, in which region the calculated content is equal to or greater than a predetermined threshold value.

Further, the thickness of the three-dimensional mesh model is fixed to a predetermined number of meshes in order to reduce the calculation load. For example, in the three-dimensional mesh shown in FIG. 6, all the respective layers is set to have a thickness of a unit mesh. Further, the analysis mesh may be formed into a model which is referred to as a laminated shell model as shown in FIG. 7, and which is configured by laminating, as the respective layers of the model, two-dimensional meshes whose thickness is not taken into account. In the present embodiment, it is assumed that the multilayer substrate analysis apparatus 10 uses the analysis mesh based on the laminated shell model.

Figure 8:
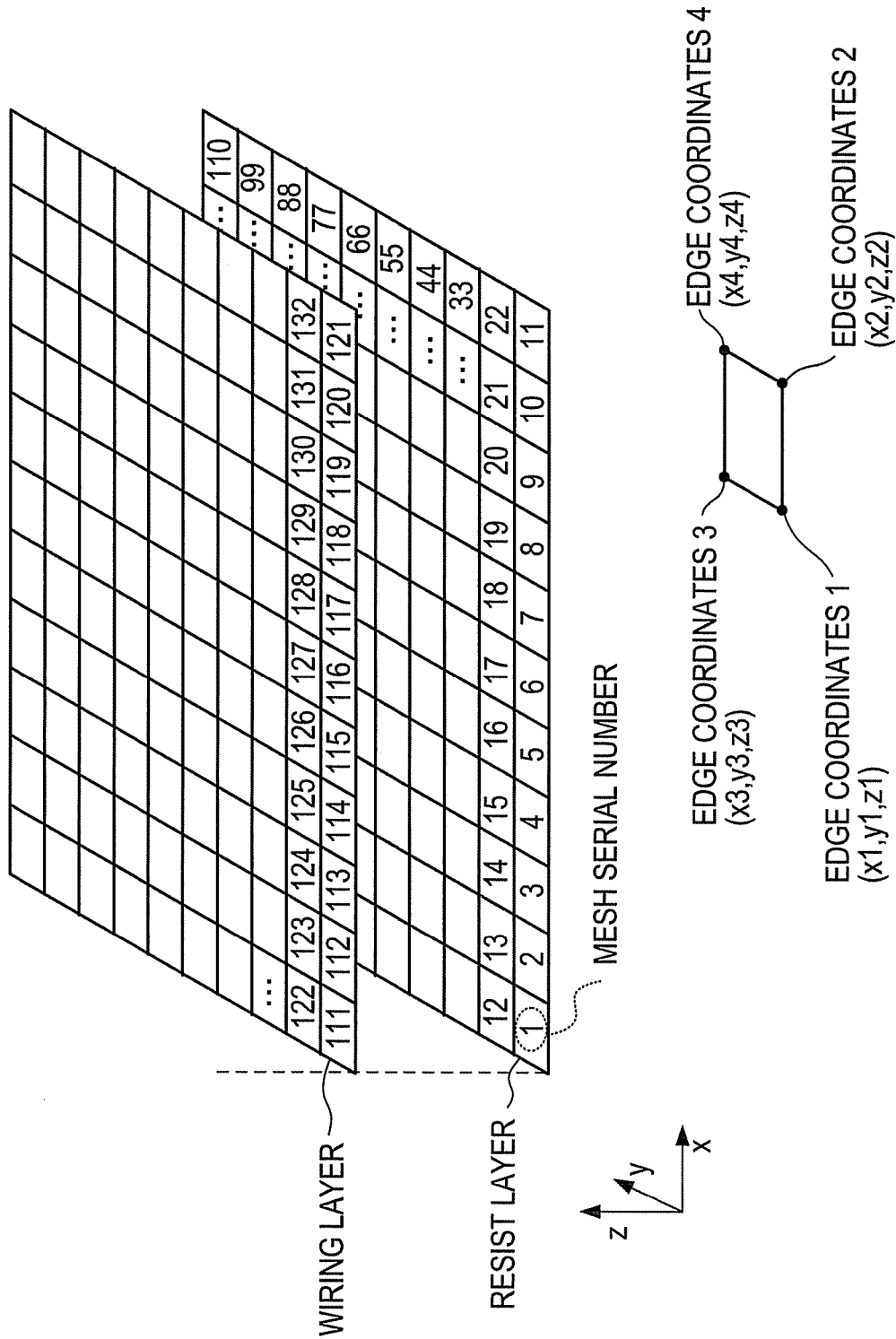
FIG. 8 is a figure showing mesh serial numbers and edge coordinates.

Further, a mesh serial number and edge coordinates are added to each mesh (hereinafter referred to as mesh) in the analysis mesh. In the following, there will be described the mesh serial number and the edge coordinates. FIG. 8 is a figure showing the mesh serial numbers and the edge coordinates. FIG. 9 is a figure showing correspondence between the mesh serial number and the edge coordinates.

As shown in FIG. 8, the mesh serial numbers are assigned to respective meshes in the order of the x-axis (the width direction of the multilayer substrate 9, shown in FIG. 13), the y-axis (the depth direction of the multilayer substrate 9), and the z-axis (the thickness direction of the multilayer substrate 9), and the edge coordinates are assigned to each of four corners of each of the meshes. Further, the mesh serial number and the edge coordinates are made to correspond to each other as shown in FIG. 9.

Next, the mesh creating section 102 (shown in FIG. 3) classifies each of the meshes in the analysis mesh for each layer and material, as shown in FIG. 5 (S202, determining operation).

Here, there will be described a method for classifying of the layer and the material. As already described, wiring layers and insulating layers in the multilayer substrate are symmetrically laminated with a layer generally referred to as a core layer as a center in the thickness direction of the core layer. Both surfaces of the multilayer substrate are configured by a resist layer.

Figure 10:
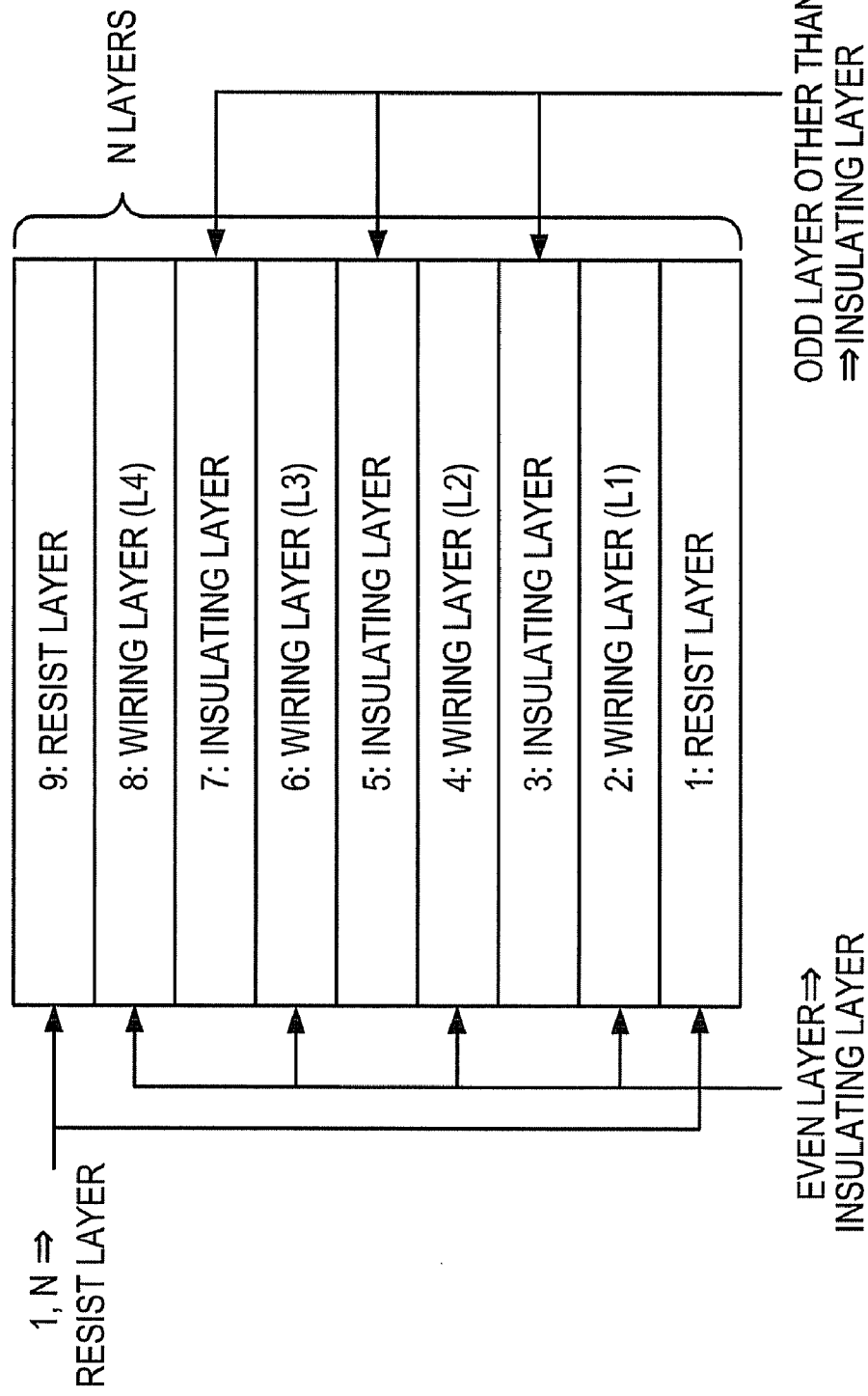
FIG. 10 is a figure showing a classification method of layers.

The mesh creating section 102 classifies the layers by utilizing this configuration. FIG. 10 is a figure showing a method for classifying the layers. First, as shown in FIG. 10, when the layers are counted in order from the lowermost layer in the thickness direction of the substrate, the mesh creating section 102 (shown in FIG. 3) sets the total number of the layers of the analysis mesh to n, and sets the first layer and the n-the layer (the 9-th layer in FIG. 10) as the resist layer. Further, the mesh creating section 102 sets, as wiring layers, even numbered layers counted from the lowermost layer in the thickness direction of the substrate, and assigns reference characters of L1, L2, L3, L4 to the wiring layers in order from the lowermost layer of the wiring layers in the thickness direction.

Further, the mesh creating section 102 sets, as insulating layers, odd numbered layers counted from the lowermost layer in the thickness direction of the substrate. Note that when it is necessary to distinguish the core layer from the other insulating layers in the analysis of the substrate, the mesh creating section 102 sets, as the core layer (central insulating layer), a layer whose order number is a number obtained by adding 1 to the integer part of the value which is obtained by dividing the total layer number n by 2 (the 5-th layer (=the integer part of 9/2+1) in the multilayer substrate 9, shown in FIG. 13).

The mesh creating section 102 classifies the kind of layers of the multilayer substrate in this way and classifies the analysis mesh for each material in each of the layers. Specifically, the mesh creating section 102 classifies the already created serial numbers by the layer configured with the mesh and by the material. FIG. 11 is a figure showing an example of the classification by the layer and the material. As shown in FIG. 11, the mesh creating section 102 (shown in FIG. 3) makes serial numbers of the meshes in the wiring layer (L1), the material of which meshes is the conductor, correspond to the name "CU_L01" of the group representing the meshes of this type. Further, similarly, the mesh creating section 102 makes serial numbers of the meshes, which are in the insulating layer between the L1 layer and the L2 layer, and the material of which is the conductor, correspond to the name "CU_L01L02" of the group representing the meshes of this type.

Figure 12:
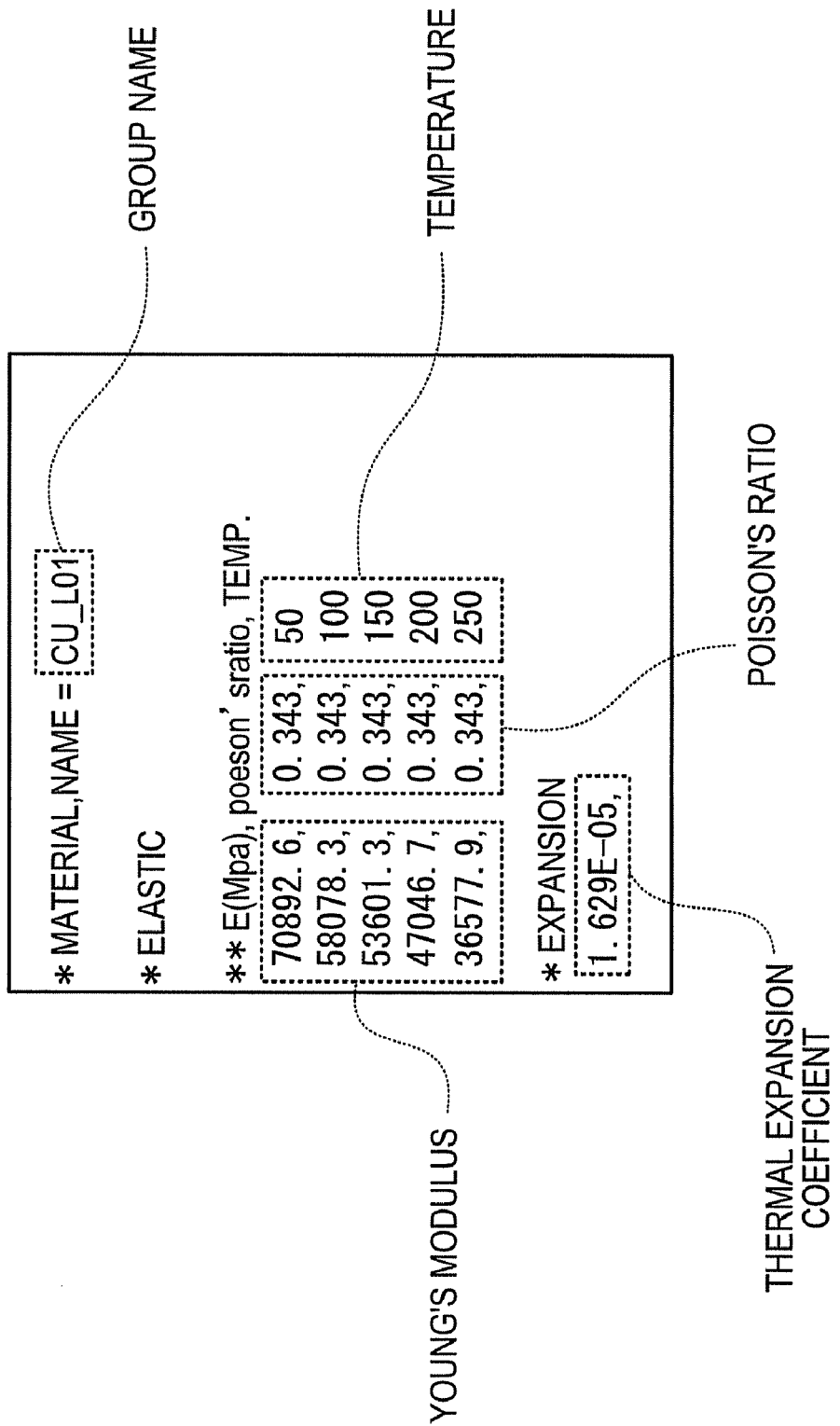
FIG. 12 is a figure showing physical property values assigned to a group.

When finishing the above described classification of the layers and the materials, the mesh creating section 102 assigns, as shown in FIG. 5, material physical property values to the analysis mesh by referring to the physical property value database 104 (S203, assigning operation). Specifically, as shown in FIG. 12 which is a figure showing physical property values assigned to a group, the mesh creating section 102 (shown in FIG. 3) represents a group name and physical property values corresponding to the group on the basis of a format which can be analyzed by the analyzing section 103 (shown in FIG. 3). Note that it may also be configured such that the multilayer substrate analysis apparatus 10 creates the analysis mesh, and that the analysis is performed by external software. In this case, the mesh creating section 102 represents a group name and physical property values corresponding to the group on the basis of a format which can be read by the external software.

After assigning the material physical property values to the analysis mesh as described above, the mesh creating section 102 selects an unselected layer in the analysis mesh (S204), and determines whether or not the selected layer is the insulating layer (S205, determining operation).

When the selected layer is the insulating layer (S205, YES), the mesh creating section 103 sets the Young's modulus of the conductor of the selected layer to 90% (S206, physical property value changing operation).

Figure 13:
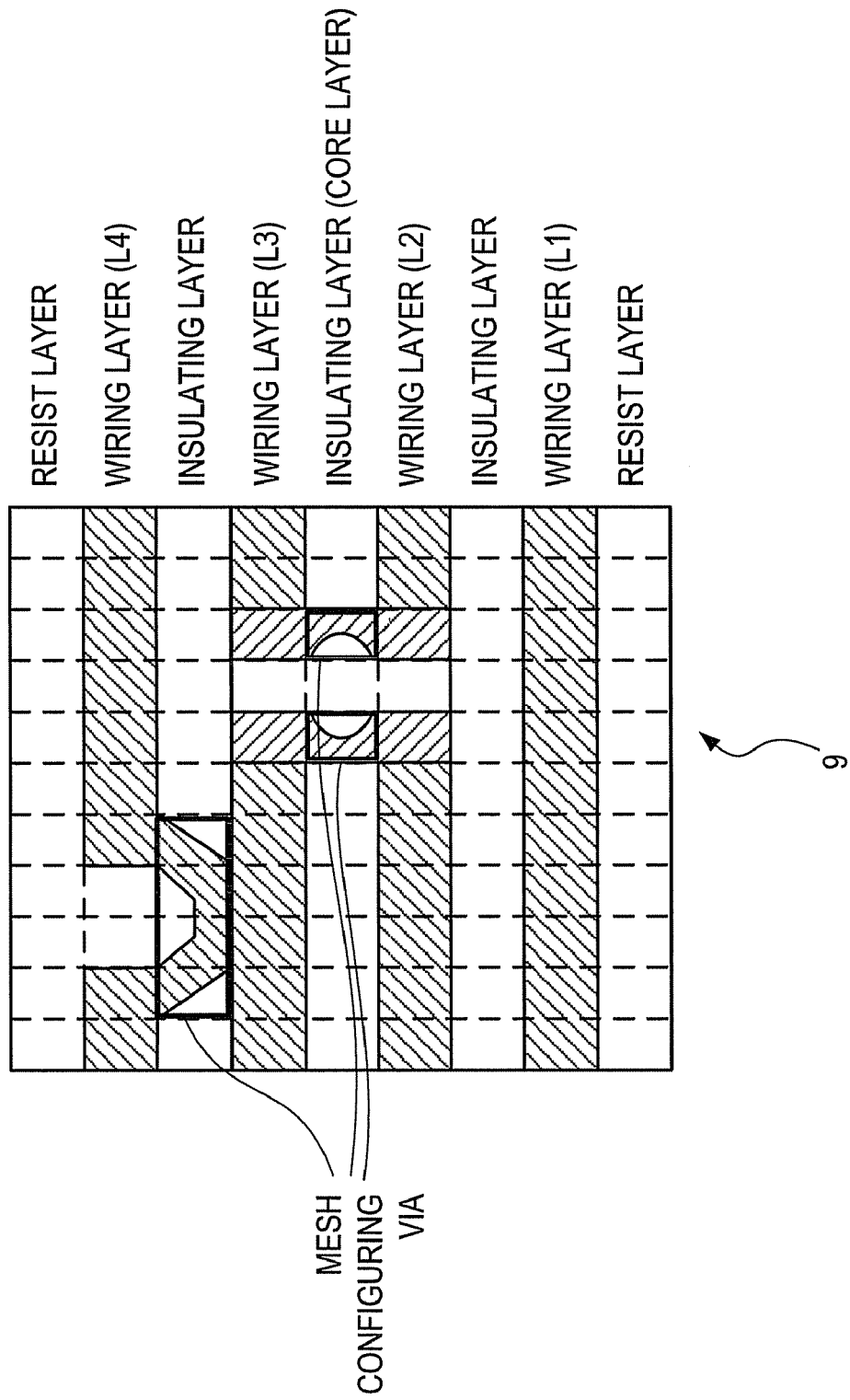
FIG. 13 is a figure showing a state where an analysis mesh is superposed on a cross section of a multilayer substrate.

Here, the changing of Young's modulus will be described. FIG. 13 is a figure showing a state where the analysis mesh is superposed on the cross section of the multilayer substrate 9. Further, FIG. 14 is a figure showing a group whose Young's modulus is changed, and showing the physical property values of the group.

In practice, as shown in FIG. 13, the shape of plating as a conductor in the mesh of the insulating layer is different from the shape of plating (that is, via plating) as the conductor of the same kind in the mesh of the wiring layer. For this reason, the physical property value (Young's modulus in the present embodiment) of the conductor to be taken into consideration in the analysis is also different between the layers. Therefore, as shown in FIG. 14, the Young's modulus in the wiring layer is set to 90%.

Figure 14:
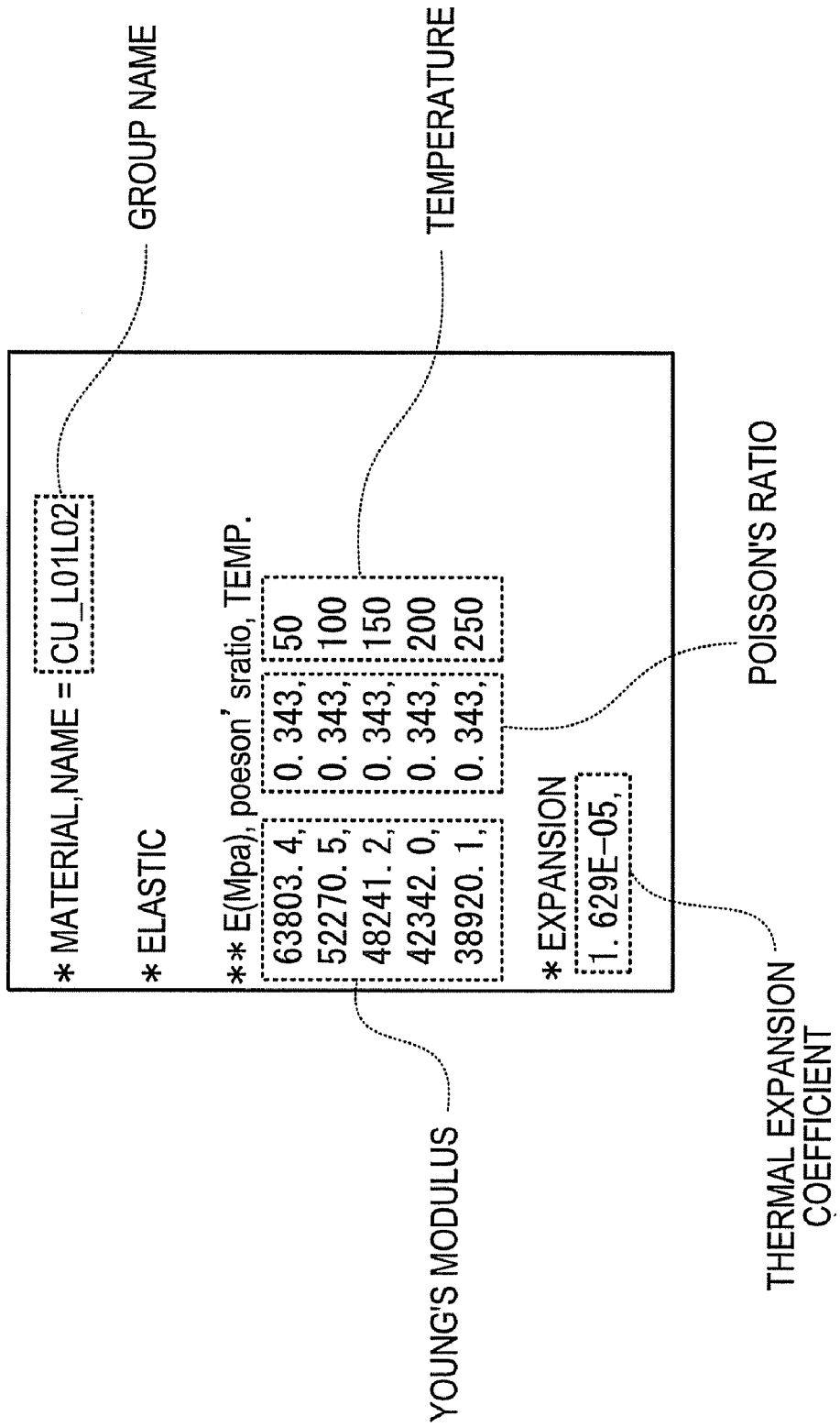
FIG. 14 is a figure showing a group in which the Young's modulus is changed, and showing physical property values of the group.

The material of the group (CU_L01L02) shown in FIG. 14 is the same as the material of the group (CU_L01) shown in FIG. 12. However, the Young's modulus of CU_L01L02 is set to 90% of the Young's modulus of CU_L01. Note that the physical property value may be changed in any manner such as, for example, by increasing or decreasing by a predetermined value. Further, the kind of the physical property value to be changed is not limited to Young's modulus, and the present embodiment is only an example.

When the Young's modulus of the conductor is changed as described above, the mesh creating section 102 (shown in FIG. 3) determines whether or not there is an unselected layer in the analysis mesh (S207).

When there is no unselected layer in the analysis mesh (S207, NO), the mesh creating section 102 ends the processing.

On the other hand, when there is an unselected layer in the analysis mesh (S207, YES), the mesh creating section 102 again selects the unselected layer in the analysis mesh (S204).

Further, in operation S205, when the selected layer is not the insulating layer (S205, NO), the mesh creating section 102 again determines whether or not there is an unselected layer in the analysis mesh (S207).

The analyzing section 103 performs the warp analysis of the multilayer substrate 9 by using the analysis mesh in which suitable physical property values are assigned to each of the meshes configuring the analysis mesh in this way. The analysis result is fed back to the design information of the multilayer substrate 9.

As described above, in the multilayer substrate 9 (shown in FIG. 13) to be analyzed, it is possible to more correctly perform the analysis of the multilayer substrate 9 by changing the physical property value of the conductor in the insulator. Further, it is possible to manufacture an electronic apparatus with less failure by configuring the electronic apparatus with the multilayer substrate 9 optimized on the basis of the higher-precision analysis.

The present invention can be carried out in other various forms without departing from the spirit or scope of the present invention. Therefore, the above describe embodiment is only an example at all points and should not be interpreted restrictively. The scope of the present invention is defined by appended claims and is not limited at all by the specific descriptions of this specification. Further, modifications, various changes, substitutions and variations, which belong to the equivalent scope of the appended claims, are all within the scope of the present invention.

Figure 15:
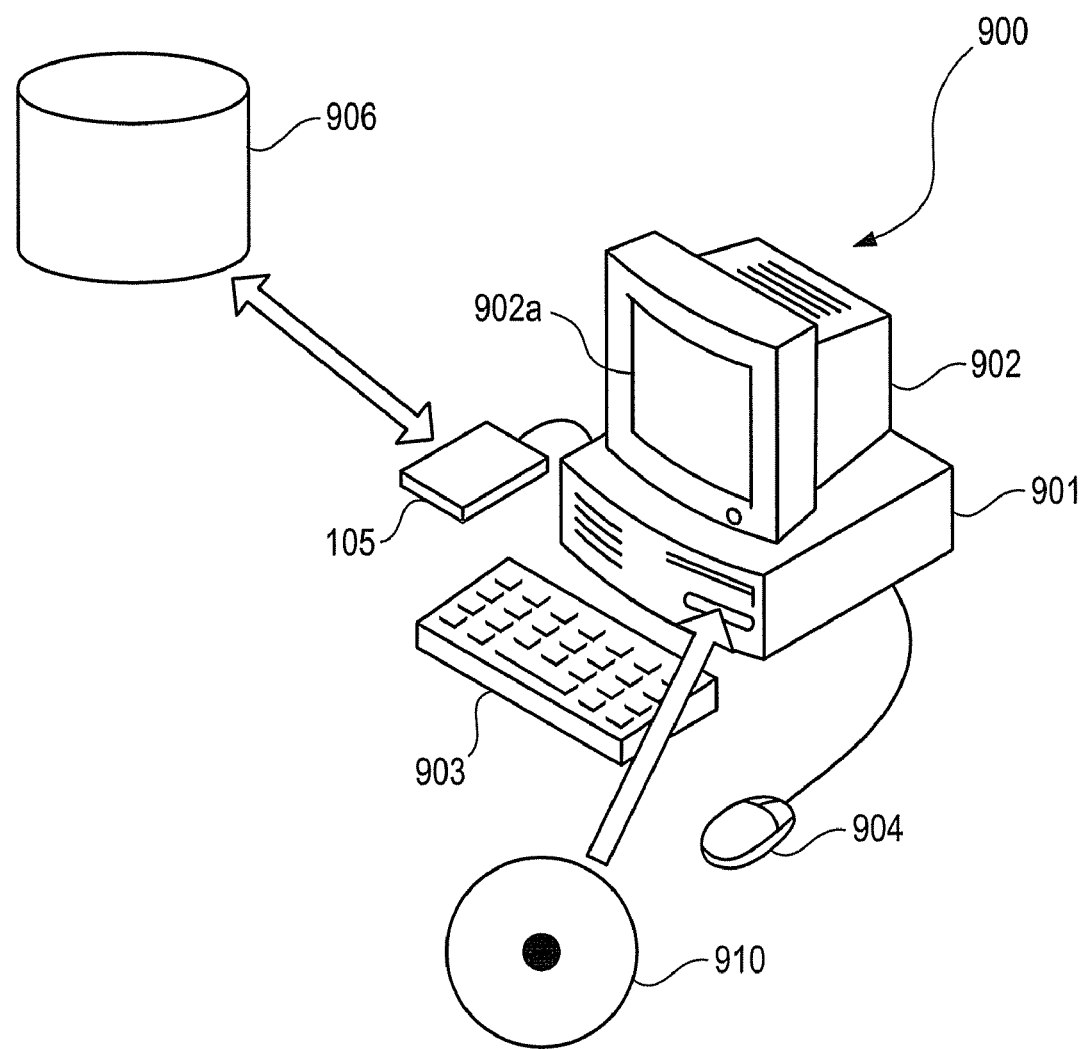
FIG. 15 is a figure showing an example of a computer system to which the present invention is applied.

Note that the present invention can be applied in a computer system as will be described below. FIG. 15 is a figure showing an example of the computer system to which the present invention is applied. The computer system 900 shown in FIG. 15 includes a main body section 901 which incorporates a CPU, a disk drive, and the like, a display 902 which displays an image according to an instruction from the main body section 901, a keyboard 903 which is used for inputting various information into the computer system 900, a mouse 904 which is used for specifying an arbitrary position on an display screen 902a of the display 902, and a communication apparatus 905 which accesses an external database, and the like, so as to download a program, and the like, stored by the other computer system. As the communication apparatus 905, there can be considered a network communication card, a modem, and the like.

It is possible to provide, as a multilayer substrate analysis program, a program which enables each of the above described operations to be performed in the computer system configuring the multilayer substrate analysis apparatus, as described above. The program can be executed by the computer system configuring the multilayer substrate analysis apparatus by being stored in a recording medium which can be read by the computer system. The program which enables each of the above described operations to be performed is stored in a portable type recording medium such as a disk 910, or is downloaded from a recording medium 906 of the other computer system by the communication apparatus 905.

Further, the multilayer substrate analysis program (multilayer substrate analysis software) which provides the computer system 900 with at least the analysis function is inputted into the computer system 900 so as to be compiled. The program enables the computer system 900 to operate as an analysis system having the analysis function.

Further, the program may be stored in a computer readable recording medium such as, for example, the disk 910. Here, examples of the recording medium which can be read by the computer system 900 include internal storage apparatuses such as a ROM and a RAM, which are mounted inside the computer, portable type storage media such as a disk 910, a flexible disk, a DVD disk, a magneto-optical disk, and an IC card, and a database which stores a computer program, or also include the other computer system, a database of the other computer system, and various recording media which can be accessed by the computer system connected via communication means such as the communication apparatus 105.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An analysis apparatus comprising:
   an assignor which assigns a physical property value corresponding to a kind of a material to each of regions formed by dividing a structural data representing a structure of a multilayer substrate;
   a determiner which determines whether or not the each of the regions is a predetermined region in a predetermined layer of the multilayer substrate; and
   a physical property value changer which changes the physical property value assigned to the region when the region is determined to be the predetermined region in the predetermined layer.

2. The analysis apparatus according to claim 1, wherein the predetermined layer is an insulating layer.

3. The analysis apparatus according to claim 1, wherein the predetermined region is a conductor.

4. The analysis apparatus according to claim 1, wherein the physical property value is Young's modulus.

5. The analysis apparatus according to claim 1, wherein the structural data is divided by using grid meshes.

6. A computer-readable recording medium encoded with a computer program that causes a computer to execute processing for an analysis comprising:
   assigning a physical property value corresponding to a kind of a material to each of regions formed by dividing a structural data representing a structure of a multilayer substrate;
   determining whether or not the each of the regions is a predetermined region in a predetermined layer of the multilayer substrate; and
   changing the physical property value assigned to the region when the region is determined to be the predetermined region in the predetermined layer.

7. The computer-readable recording medium according to claim 6, wherein the predetermined layer is an insulating layer.

8. The computer-readable recording medium according to claim 6, wherein the predetermined region is a conductor.

9. The computer-readable recording medium according to claim 6, wherein the physical property value is Young's modulus.

10. The computer-readable recording medium according to claim 6, wherein the structural data is divided by using grid meshes.

11. An analytical method comprising:
assigning a physical property value corresponding to a kind of a material to each of regions formed by dividing a structural data representing a structure of a multilayer substrate;
determining whether or not the each of the regions is a predetermined region in a predetermined layer of the multilayer substrate; and
changing the physical property value assigned to the region when the region is determined to be the predetermined region in the predetermined layer.

12. The analytical method according to claim 11, wherein the predetermined layer is an insulating layer.

13. The analytical method according to claim 11, wherein the predetermined region is a conductor.

14. The analytical method according to claim 11, wherein the physical property value is Young's modulus.

* * * * *